(12) United States Patent
Gandikota et al.

(10) Patent No.: US 9,583,349 B2
(45) Date of Patent: Feb. 28, 2017

(54) LOWERING TUNGSTEN RESISTIVITY BY REPLACING TITANIUM NITRIDE WITH TITANIUM SILICON NITRIDE

(71) Applicant: Applied Materials, Inc., Santa Clara, CA (US)

(72) Inventors: Srinivas Gandikota, Santa Clara, CA (US); Zhendong Liu, San Jose, CA (US); Jianxin Lei, Fremont, CA (US); Rajkumar Jakkaraju, Sunnyvale, CA (US)

(73) Assignee: APPLIED MATERIALS, INC., Houston, TX (US)

( * ) Notice: Subject to any disclaimer, the term of this patent is extended or adjusted under 35 U.S.C. 154(b) by 0 days.

(21) Appl. No.: 14/553,842

(22) Filed: Nov. 25, 2014

(65) Prior Publication Data

US 2015/0206756 A1    Jul. 23, 2015

Related U.S. Application Data

(62) Division of application No. 13/922,063, filed on Jun. 19, 2013, now abandoned.

(60) Provisional application No. 61/665,159, filed on Jun. 27, 2012.

(51) Int. Cl.
*H01L 21/28* (2006.01)
*H01L 21/285* (2006.01)
(Continued)

(52) U.S. Cl.
CPC ...... *H01L 21/28273* (2013.01); *H01L 21/285* (2013.01); *H01L 21/28061* (2013.01);
(Continued)

(58) Field of Classification Search
CPC ......... H01L 21/28061; H01L 21/76889; H01L 21/2855
See application file for complete search history.

(56) References Cited

U.S. PATENT DOCUMENTS

| 4,570,328 A | 2/1986 | Price et al. |
| 4,605,947 A | 8/1986 | Price et al. |
| (Continued) | | |

OTHER PUBLICATIONS

Office Action for U.S. Appl. No. 13/922,063 dated Dec. 16, 2013.
Final Office Action for U.S. Appl. No. 13/922,063 dated Jun. 25, 2014.

*Primary Examiner* — Kevin Parendo
(74) *Attorney, Agent, or Firm* — Patterson + Sheridan, LLP

(57) ABSTRACT

Semiconductor devices, methods and apparatus for forming the same are provided. The semiconductor device includes a substrate having a source and drain region and a gate electrode stack on the substrate between the source and drain regions. The gate electrode stack includes a conductive film layer on a gate dielectric layer, a refractory metal silicon nitride film layer on the conductive film layer, and a tungsten film layer on the refractory metal silicon nitride film layer. In one embodiment, the method includes positioning a substrate within a processing chamber, wherein the substrate includes a source and drain region, a gate dielectric layer between the source and drain regions, and a conductive film layer on the gate dielectric layer. The method also includes depositing a refractory metal silicon nitride film layer on the conductive film layer and depositing a tungsten film layer on the refractory metal silicon nitride film layer.

11 Claims, 7 Drawing Sheets

(51) Int. Cl.
- *H01L 21/768* (2006.01)
- *H01L 29/78* (2006.01)
- *H01L 29/66* (2006.01)
- *H01L 29/49* (2006.01)
- *H01L 27/108* (2006.01)

(52) U.S. Cl.
CPC .. *H01L 21/28568* (2013.01); *H01L 21/76889* (2013.01); *H01L 29/4941* (2013.01); *H01L 29/66477* (2013.01); *H01L 29/78* (2013.01); *H01L 21/2855* (2013.01); *H01L 27/10873* (2013.01)

(56) References Cited

U.S. PATENT DOCUMENTS

| | | | |
|---|---|---|---|
| 5,903,053 A * | 5/1999 | Iijima et al. | 257/751 |
| 6,440,261 B1 | 8/2002 | Tepman et al. | |
| 6,458,251 B1 * | 10/2002 | Sundarrajan et al. | 204/192.12 |
| 2002/0008294 A1 | 1/2002 | Hayashi et al. | |
| 2002/0029093 A1 | 3/2002 | Miller et al. | |
| 2004/0055880 A1 | 3/2004 | Gung et al. | |
| 2005/0023620 A1 | 2/2005 | Iyer | |
| 2005/0023701 A1 * | 2/2005 | Kajita | H01L 21/76843 257/774 |
| 2007/0248756 A1 * | 10/2007 | Krisko | C03C 17/002 427/255.15 |
| 2008/0061386 A1 | 3/2008 | Taguwa | |
| 2008/0081452 A1 | 4/2008 | Kim et al. | |
| 2008/0196661 A1 | 8/2008 | West | |
| 2008/0242072 A1 | 10/2008 | Choi et al. | |
| 2009/0065870 A1 | 3/2009 | Li et al. | |
| 2009/0087585 A1 | 4/2009 | Lee et al. | |
| 2011/0303960 A1 * | 12/2011 | Cao et al. | 257/315 |
| 2012/0164459 A1 * | 6/2012 | Chang | C23C 14/022 428/457 |

* cited by examiner

LOWERING TUNGSTEN RESISTIVITY BY REPLACING TITANIUM NITRIDE WITH TITANIUM SILICON NITRIDE

CROSS-REFERENCE TO RELATED APPLICATIONS

This application is a divisional of co-pending U.S. patent application Ser. No. 13/922,063, filed Jun. 19, 2013, which claims benefit of U.S. provisional patent application Ser. No. 61/665,159, filed Jun. 27, 2012, both of which are herein incorporated by reference in their entirety.

BACKGROUND

Field

Embodiments of the present invention generally relate to methods and an apparatus of forming integrated circuits. More particularly, embodiments of the invention relate to methods and an apparatus for forming a gate electrode and associated layers.

Description of the Related Art

Integrated circuits may include more than one million micro-electronic devices such as transistors, capacitors, and resistors. One type of integrated circuit is field effect transistors (e.g., metal-oxide-semiconductor field effect transistors (MOSFET or MOS)) that are formed on a substrate (e.g., a semiconductor substrate) and cooperate to perform various functions within the circuit. A MOSFET transistor comprises a gate structure disposed between source and drain regions that are formed in the substrate. The gate structure generally comprises a gate electrode and a gate dielectric. The gate electrode is disposed over the gate dielectric to control a flow of charge carriers in a channel region formed between the drain and source regions beneath the gate dielectric. To increase the speed of the transistor, the gate may be formed from materials that lower the resistivity of the gate.

The gate dielectric layer may be formed of dielectric materials such as silicon dioxide ($SiO_2$), or a high-k dielectric material having a dielectric constant greater than 4.0, such as SiON, SiN, hafnium oxide ($HfO_2$), hafnium silicate ($HfSiO_2$), hafnium silicon oxynitride (HfSiON), zirconium oxide ($ZrO_2$), zirconium silicate ($ZrSiO_2$), barium strontium titanate ($BaSrTiO_3$, or BST), lead zirconate titanate ($Pb(ZrTi)O_3$, or PZT), and the like. It should be noted, however, that the film stack may comprise layers formed of other materials.

Gate stacks may also incorporate metal layers formed on the high-k dielectric and on a polysilicon layer on the high-k dielectric. The metal layers may include Ti, TiN, W, WN, $WSi_xN_y$, or other metals.

Tungsten (W) may be particularly useful in gate electrodes and word and bit lines in DRAM types of integrated circuit devices because of its thermal stability during subsequent high temperature processes, where processing temperatures may reach 900° C. or more. Additionally, tungsten is a highly refractive material which offers good oxidation resistance and also lower resistivity. Melted, refined tungsten in bulk form typically has a resistivity of 5.5 μohms-cm. However, when tungsten is formed in thin films (e.g. less than 400 Å), the resistivity may be between 11-15 μohms-cm. For example, tungsten films formed using past PVD technology typically have a resistivity of 11-11.5 μohms-cm, whereas tungsten films formed using CVD technology typically have a resistivity of 13-15 μohms-cm.

Additionally, when thin film tungsten is combined with other materials such as WN or TiN, the resistivity of the tungsten film and the electrode stack may jump very high. For example, the resistivity of W on WN on polysilicon (poly) or tungsten on $WSi_xN_y$ on poly may be between 20-25 μohms-cm. In other examples, the resistivity of W on WN/Ti underlayer may be 15 μohms-cm or more and the resistivity of W on TiN may be as high as 30-40 μohms-cm. Lowering the resistivity of the tungsten film and as a result the gate electrode stack, may allow decreased dielectric thicknesses, reduced heights of the gate and distances between gate and bit lines, thereby improving overall switching speed of the gate electrode.

One solution for lowering the resistivity of tungsten on TiN is to insert tungsten silicide or silicon interlayers in between tungsten and TiN. Although this solution provides decreased resistivity, it requires the use of an additional chamber to deposit the silicon containing interlayer which increases processing time and correspondingly increases cost of ownership.

Further, in conventional MOS fabrication schemes, the substrate is required to pass between tools having the various reactors coupled thereto. The process of passing the substrate between tools necessitates the removal of the substrate from the vacuum environment of one tool for transfer at ambient pressures to the vacuum environment of a second tool. In the ambient environment, the substrates are exposed to mechanical and chemical contaminants, such as particles, moisture, and the like, that may damage the gate structures being fabricated and possibly form an undesired interfacial layer, e.g., native oxide, between each layer while transferring. As gate structures become smaller and/or thinner to increase the device speed, the detrimental effect of forming interfacial layers or contamination becomes an increased concern. Additionally, the time spent on transferring the substrate between the cluster tools decreases productivity in manufacture of the field effect transistors. Plus, advances in the reduction of critical dimension (CD) geometries of integrated circuits have also created a high demand for improved material properties.

Thus, although tungsten is a useful metal for gate electrodes, decreasing the resistivity of tungsten while reducing processing time may further help to improve gate electrode stack performance and modify the gate electrode materials to decrease the overall resistivity of the entire gate electrode stack. Therefore, there is a need in the art for methods and an apparatus for forming a gate stack that has improved properties.

SUMMARY

Embodiments of the present invention generally relate to methods and an apparatus of forming integrated circuits. More particularly, embodiments of the invention relate to methods and an apparatus for forming a gate electrode and associated layers. In one embodiment, a semiconductor device is provided. The semiconductor device comprises a substrate having a source and drain region and a gate electrode stack on the substrate between the source and drain regions. The gate electrode stack comprises a conductive film layer on a gate dielectric layer, a refractory metal silicon nitride film layer on the conductive film layer and a tungsten film layer on the refractory metal silicon nitride film layer.

In another embodiment, a method of forming a gate electrode stack is provided. The method comprises positioning a substrate within a processing chamber, wherein the substrate comprises a source and drain region, a gate dielectric layer between the source and drain regions, and a conductive film layer on the gate dielectric layer, forming a refractory metal silicon nitride film layer on the conductive film layer and forming a tungsten film layer on the refractory metal silicon nitride film layer.

In yet another embodiment, a method of depositing a tungsten thin film is provided. The method comprises forming a plasma in a processing region of a chamber using an RF or DC power supply coupled to a titanium silicon alloy target in the chamber, the target having a first surface that is in contact with the processing region of the chamber and a second surface that is opposite the first surface, delivering energy to form a plasma in a processing region of a chamber, wherein delivering energy comprises delivering RF power from an RF power supply to a target or delivering DC power from a DC power supply to the target, rotating a magnetron about the center point of the target, biasing the substrate support with an RF power supply, flowing a nitrogen-containing gas into the processing region and depositing a tungsten silicon nitride film layer on a substrate positioned on the substrate support in the chamber.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized in other embodiments without specific recitation.

DETAILED DESCRIPTION

Embodiments of the invention generally provide a gate electrode stack structure having a reduced sheet resistance ($R_s$) or resistivity and methods and apparatuses of forming the same. In one embodiment, the gate electrode stack structure may be formed for a memory type semiconductor device, such as a DRAM type integrated circuit.

Physical Vapor Deposition (PVD) of tungsten (W) is the material choice for DRAM gate electrodes. Gate electrode stacks typically comprise layers of Ti/WN/W, TiN/WSi/WN/W, TiN/WN/W, TiN/WSi/WN/W or combinations thereof depending on the desired integration scheme. The TiN layer acts as a diffusion barrier preventing interaction between the Poly-Si layer and W layers during subsequent RTP anneal steps. W resistivity on $SiO_2$ is about 9.0 $\mu$ohms-cm for a 500 Å film. W resistivity on TiN is about 24 $\mu$ohms-cm but the resistivity can be lowered to 11 $\mu$ohms-cm by inserting a thin silicon layer (<50 Å). Embodiments of the present invention relate to replacing TiN with titanium-silicon-nitride (TiSiN) to further lower W resistivity. TiSiN may be deposited by reactive sputtering of a titanium-silicon alloy target in an $Ar/N_2$ environment. In certain embodiments, TiSiN may be deposited using chemical vapor deposition (CVD) and/or atomic layer deposition (ALD) techniques. W resistivity on TiN is typically 24 $\mu$ohms-cm and the tungsten resistivity has been lowered to approximately 11.6 $\mu$ohms-cm by replacing TiN with TiSiN. For comparison, W resistivity on TiN/Si/W is approximately 11 $\mu$ohms-cm. One advantage of the embodiments described herein is that a stack that requires three chambers (TiN, Si and W) may be replaced by a stack that requires two chambers (TiSiN and W) without a significant loss of stack resistivity thus reducing cost of ownership.

Figure 1A:
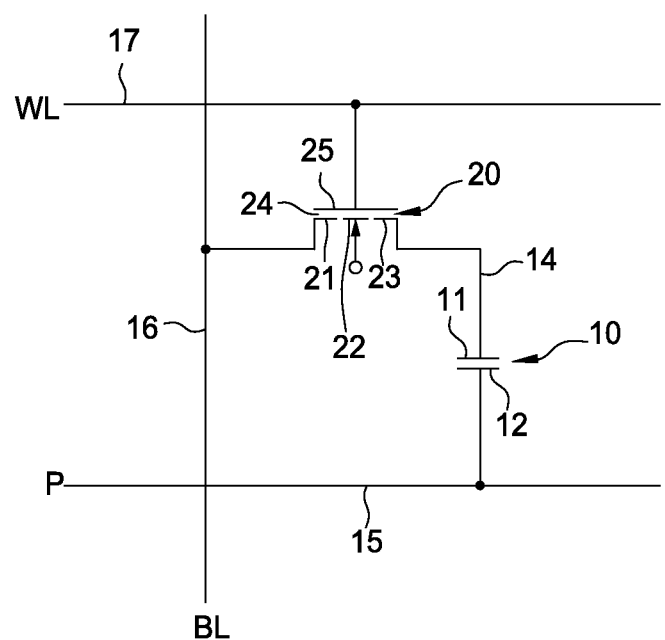
FIG. 1A illustrates a circuit diagram of a dynamic memory cell in a DRAM memory.

Turning now to FIG. 1A, a circuit diagram of a one transistor cell such as may be used in DRAM memories is illustrated. The one transistor memory cell comprises a storage capacitor 10 and a selection transistor 20. In this case, the selection transistor 20 is formed as a field effect transistor and has a first source/drain electrode 21 and a second source/drain electrode 23 between which an active region 22 is arranged. Above the active region 22 are the gate insulating layer or dielectric layer 24 and gate electrode 25, together which act like a plate capacitor and can influence the charge density in the active region 22 in order to form or block a current conducting channel between the first source/drain electrode 21 and the second source/drain electrode 23.

The second source/drain electrode 23 of the selection transistor 20 is connected to a first electrode 11 of the storage capacitor 10 via a connecting line 14. A second electrode 12 of the storage capacitor 10 is in turn connected to a capacitor plate 15 which may be common to storage capacitors of the DRAM memory cell arrangement. The first electrode 21 of the selection transistor 20 is furthermore connected to a bit line 16 in order that the information stored in a storage capacitor 10 in the form of charges can be written in and read out. In this case the write in or read out operation is controlled via a word line 17 which is connected to the gate electrode 25 of the selection transistor 20. The write in or read out operation occurs by applying a voltage to produce a current conducting channel in the active region 22 between the first source/drain electrode 21 and the second source/drain electrode 23.

Different types of capacitors may be used as the capacitor 10 in DRAM type memory cells such as trench capacitors, stacked capacitors, and planar capacitors. With increasing miniaturization of the DRAM type memory cells and as ever decreasing cross-sections of the trench capacitor, additional measures are necessary in order to provide a reduced RC time constant of a circuit e.g. a MOS device of a DRAM type memory cell. The RC time constant is the time required to charge the capacitor through the resistor to a percentage of full charge or to discharge it to a percent of its initial voltage. The RC time constant is equal to the product of the circuit resistance and the circuit capacitance. The gate electrode is one contributor to the circuit resistance. Thus, one way to reduce the RC time constant of a MOS device in a DRAM type memory cell may be to reduce the resistance of the gate electrode.

Figure 1B:
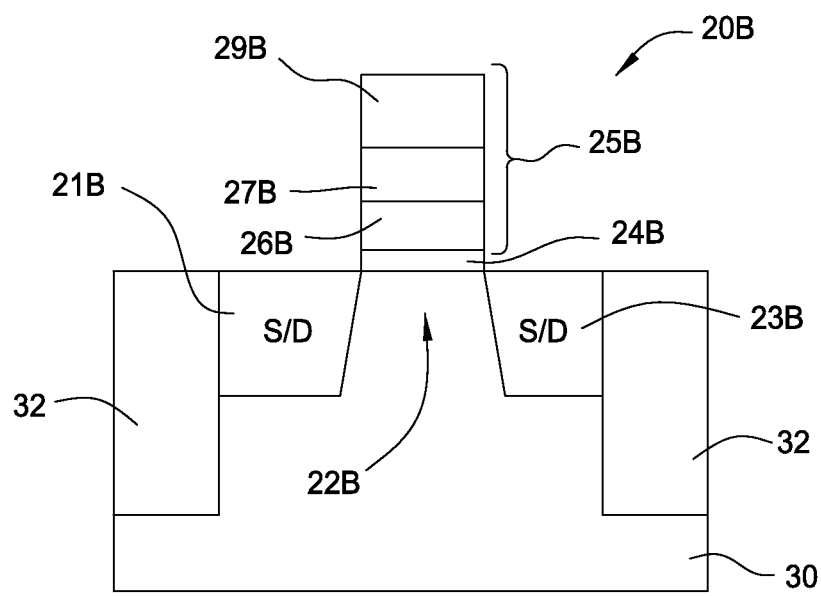
FIG. 1B illustrates a gate electrode stack according to one embodiment of the invention.

FIG. 1B illustrates a gate electrode stack 25B of a MOS device 20B that may be used in a DRAM type memory cell, such as the selection transistor 20 of FIG. 1A. The semiconductor device such as MOS device 20B is formed on a substrate 30. The substrate may be formed from any type of semiconductor material such as silicon, germanium, etc. The MOS device 20B includes source and drain regions 21B and 23B on the substrate 30. The source and drain regions 21B and 23B may be formed by doping the substrate 30 using conventional doping techniques. The area below the gate electrode stack 25B may be a lightly doped region 22B of the substrate 30, where the dopant provides a different conductivity than the dopant used to form the source and drain regions 21B, 23B. Additionally, shallow trench isolation regions 32 may also be formed on the substrate 30.

The gate electrode stack 25B is formed between the source and drain regions 21B and 23B. A gate dielectric layer 24B may be formed on the area of the substrate above the lightly doped region 22B. The gate dielectric layer may be made from various dielectric materials, including low-k dielectric materials, to insulate the gate from the substrate 30. On the gate dielectric layer 24B is a conductive film layer 26B that forms part of the gate electrode stack 25B. The conductive film layer 26B may be polysilicon or other types of conductive films used for gate electrode stacks. The gate electrode stack 25B also includes a refractory metal silicon nitride film layer 27B on the conductive film layer 26B. Refractory metal silicon nitride films may include titanium silicon nitride (TiSiN), tungsten silicon nitride (WSiN), as well as silicon nitrides of other refractory metals such as zirconium, hafnium, tantalum, vanadium, chromium to name a few. The refractory metal silicon nitride film layer may have a thickness from about 20 Å to about 500 Å. The refractory metal silicon nitride film layer may have a thickness from about 50 Å to about 150 Å. In one embodiment, the refractory metal film layer thickness is about 100 Å. The refractory metal silicon nitride film layer may be a thin film deposited using various techniques, such as PVD, CVD, and ALD techniques. The refractory metal silicon nitride film layer may include a dopant, such as boron. In certain embodiments, a refractory metal nitride film layer (e.g., TiN) may be formed between the conductive film layer 26B and the refractory metal silicon nitride film layer 27B.

The gate electrode stack 25B also includes a tungsten film 29B layer on the refractory metal silicon nitride film layer 27B. Tungsten may be in an alpha or beta phase. In one embodiment, the thin tungsten film 29B may be formed in an alpha phase, which helps reduce the resistivity of tungsten. The tungsten film layer may have a thickness from about 50 Å to about 1,000 Å. The tungsten film layer may have a thickness from about 450 Å to about 550 Å. In one embodiment, the tungsten film layer has a thickness of about 500 Å. In one embodiment, the tungsten film layer may have a resistivity of less than 12 $\mu$ohms-cm. In one embodiment, the tungsten film layer may have a resistivity of less than 10 $\mu$ohms-cm. In one embodiment, the tungsten film layer may have a resistivity of less than 9.5 $\mu$ohms-cm. In one embodiment, the tungsten film layer has a resistivity of 9.15 $\mu$ohms-cm.

The gate electrode stack may have a thickness from about 450 Å to 650 Å. The resistivity of W in the gate electrode stack may be between about 10 $\mu$ohms-cm and 14 $\mu$ohms-cm, such as between 11 to 12 $\mu$ohms-cm. In one embodiment, the resistivity of W in the gate electrode stack may be about 11.5 $\mu$ohms-cm. The gate electrode stack having a refractory metal silicon nitride film layer disposed below tungsten has a resistivity comparable to the resistivity of a gate electrode stack having a layer of silicon interposed between the tungsten and refractory metal nitride layer.

Processing Details

Figure 2A:
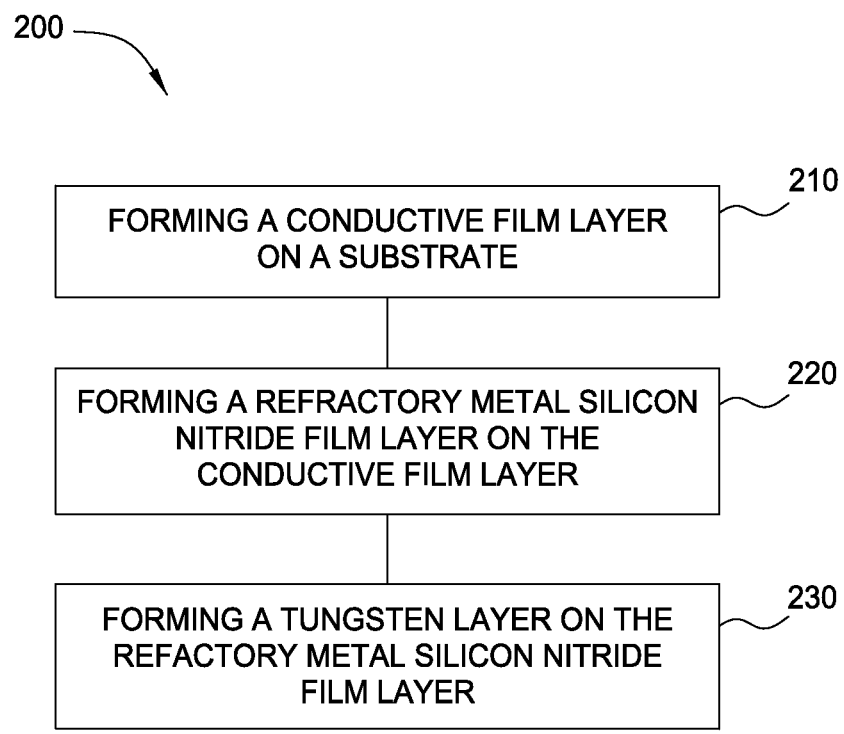
FIG. 2A illustrates a process diagram of a method of forming a gate electrode stack according to one embodiment of the invention.

FIG. 2A illustrates a process diagram of a method 200 of forming a gate electrode stack according to one embodiment of the invention. At process 210, a conductive film layer may be formed on a substrate. The substrate may be a gate dielectric layer. The method may also include positioning a substrate within a processing chamber, wherein the substrate comprises a source and drain region, a gate dielectric layer between the source and drain regions, and a conductive film layer on the gate dielectric layer. At process 220, a refractory metal silicon nitride film layer may be formed on the conductive film layer. At process 230, a tungsten film layer may be formed on the refractory metal silicon nitride film layer.

Figure 3:
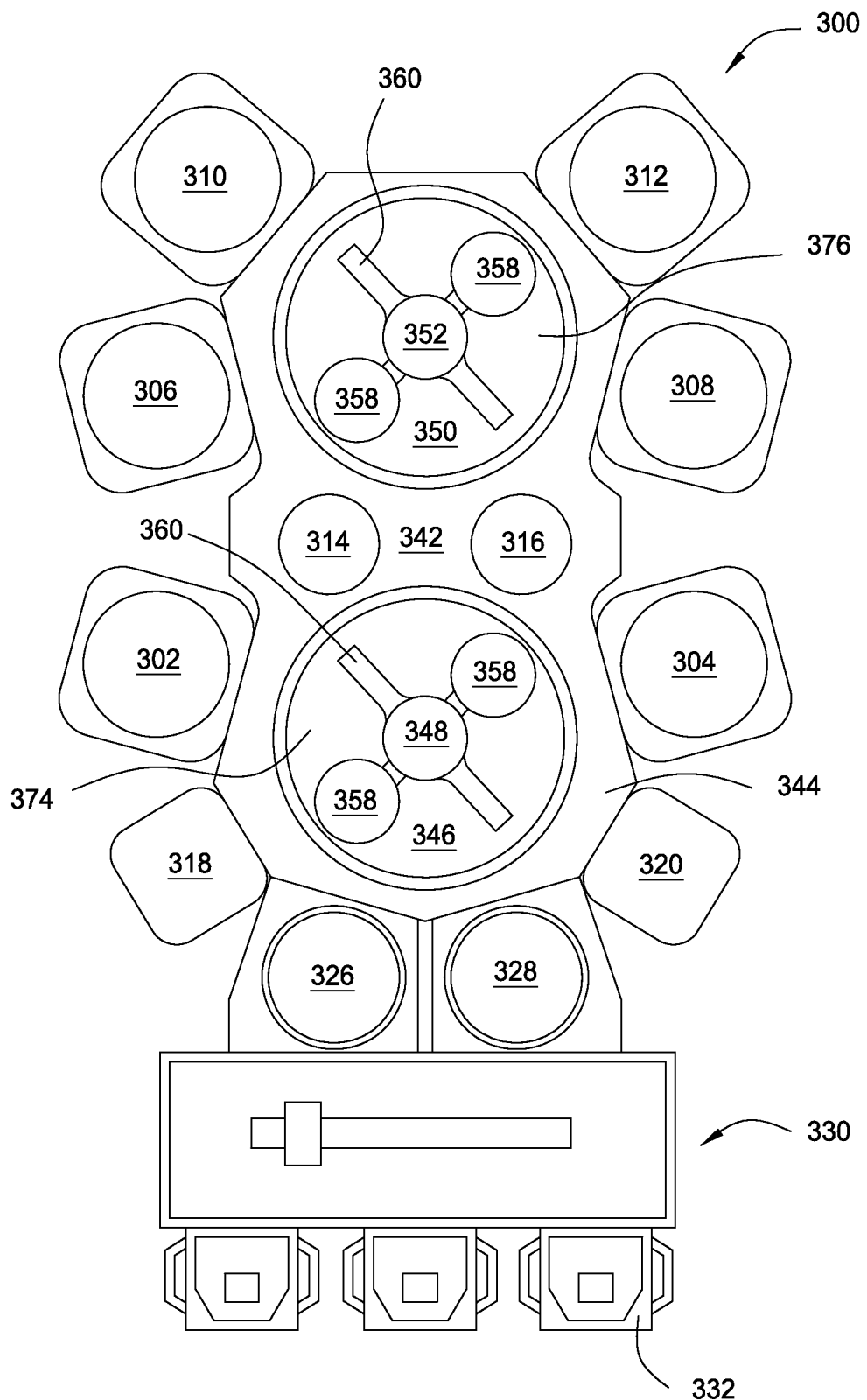
FIG. 3 illustrates a platform system having multiple chambers for forming a gate electrode stack according to one embodiment of the invention.

In one embodiment, formation of the refractory metal silicon nitride film layer and the tungsten film layer are all formed in-situ, such as in a processing system 300 as illustrated in FIG. 3 and described below. In another embodiment, the films are formed in separate processing systems, where a vacuum break occurs between formation of some of the film layers. In other words, formation of the various films layers may be formed ex-situ. For example, the refractory metal silicon nitride film may be formed in a different processing system than the tungsten film layer. Thus, some of the refractory metal silicon nitride film may be exposed to oxygen whereby a layer of native oxide is formed on the refractory metal silicon nitride film, such as $SiO_2$. In one embodiment, the native oxide film is removed and the refractory metal silicon nitride film cleaned prior to formation of the tungsten film layer.

At process 210, a conductive film may be formed on a substrate (e.g., a gate dielectric layer) using conventional methods. For example, a gate oxide may be deposited on the substrate 30 using CVD techniques, followed by depositing a polysilicon layer, also by CVD techniques. Prior to formation of the refractory metal silicon nitride film layer, the substrate may be subjected to a pre-clean process and/or a degas process. For example, if the conductive film is a polysilicon layer, the Applied Materials SICONI™ Preclean process may be performed on the substrate for removing oxide from the polysilicon layer. The SICONI™ Preclean process removes native oxide through a low-temperature, two-step dry chemical clean process using $NF_3$ and $NH_3$.

At process 220, the refractory metal silicon nitride film layer may be formed using a PVD process, a CVD process, or an ALD process. For example, when forming a titanium-silicon nitride layer, a plasma may be generated with nitrogen gas and power supplied to a titanium-silicon alloy target to deposit a titanium-silicon nitride film. In one embodiment, a titanium seed layer is first deposited on a polysilicon layer to improve adhesion of the titanium-silicon nitride layer subsequently formed on the titanium seed layer. In one embodiment, a DC power source may be applied to the target and an RF bias may be applied to the substrate support during deposition of the titanium seed layer and the titanium silicon nitride layer.

In one embodiment, the refractory metal silicon nitride film layer may be deposited using a PVD process having an RF power source coupled to the target. The target may be a titanium-silicon alloy target. The titanium-silicon alloy target may comprise from about 5 at. % to about 95 at. % silicon and from about 5 at. % to about 95 at. % titanium. The plasma may be generated from a non-reactive gas such as argon (Ar), krypton (Kr), etc. For example, a plasma may be generated from a non-reactive gas having a flow rate within a range from about 30 standard cubic centimeters (sccm) to about 60 sccm, such as about 40 sccm. An RF power may be applied to the target at a power level within a range from about 50 W to about 4,000 W, for example, about 300 W to about 600 W, such as about 500 W. A nitrogen-containing gas (e.g., $N_2$) may have a flow rate within a range of 10 sccm to about 100 sccm, such as about 30 sccm. The deposition chamber may be pressurized from about 0.1 mTorr to about 500 mTorr. The deposition chamber may be pressurized from about 0.1 mTorr to about 100 mTorr, for example, from about 1.5 mTorr to about 4.5 mTorr, such as 2.5 mTorr. The substrate may be electrically "floating" and have no bias.

In another embodiment, the plasma may be generated using a DC power source coupled to the target. Additionally, an RF power source may also be used to perform an RF clean of the chamber and the target after a certain number of cycles to prevent particles from forming on the shield or other areas of the chamber and contaminating subsequent films deposited in the chamber, and for removing native oxide that may form on the target. The substrate may be electrically "floating" and have no bias. In this embodiment, plasma may be generated from an Ar gas having a flow rate within a range from about 30 sccm to about 60 sccm, such as about 40 sccm. A DC power may be applied to the target at a power level within a range from about 50 W to about 5,000 W, from about 250 W to about 550 W, for example between about 300 W to about 500 W, such as about 400 W. The deposition chamber may be pressurized from about 0.1 mTorr to about 500 mTorr. The deposition chamber may be pressurized from about 0.1 mTorr to about 100 mTorr, for example, from about 1.5 mTorr to about 4.5 mTorr, such as 2.5 mTorr. In another embodiment, the refractory metal silicon nitride film layer may be formed using an ALD or CVD process.

In any of the techniques for forming a refractory metal silicon nitride film layer, the deposition rate may be between 0.10 Å/s to 10 Å/s, for example, from about 0.30 Å/s to about 0.80 Å/s. For example, the deposition rate using a DC power supply may be 0.58 Å/s, whereas using an RF power supply may be 0.43 Å/s. The thickness of the refractory metal silicon nitride film layer may be between about 50 Å and about 150 Å. In one embodiment, the refractory metal silicon nitride film layer may be about 100 Å thick. The resistivity of the gate electrode stack may vary depending on the thickness and technique used to depositing the refractory metal silicon nitride film layer.

A tungsten film formed on the refractory metal silicon nitride film layer may have a resistivity less than 12.0 μohms-cm. For example, the tungsten film may have a resistivity less than 11.6 μohms-cm. In some embodiments, the tungsten film may have a resistivity as low as 11.20 or 11.15 μohms-cm. In some embodiments the tungsten film may have a resistivity less than 11.00 μohms-cm.

Figure 4A:
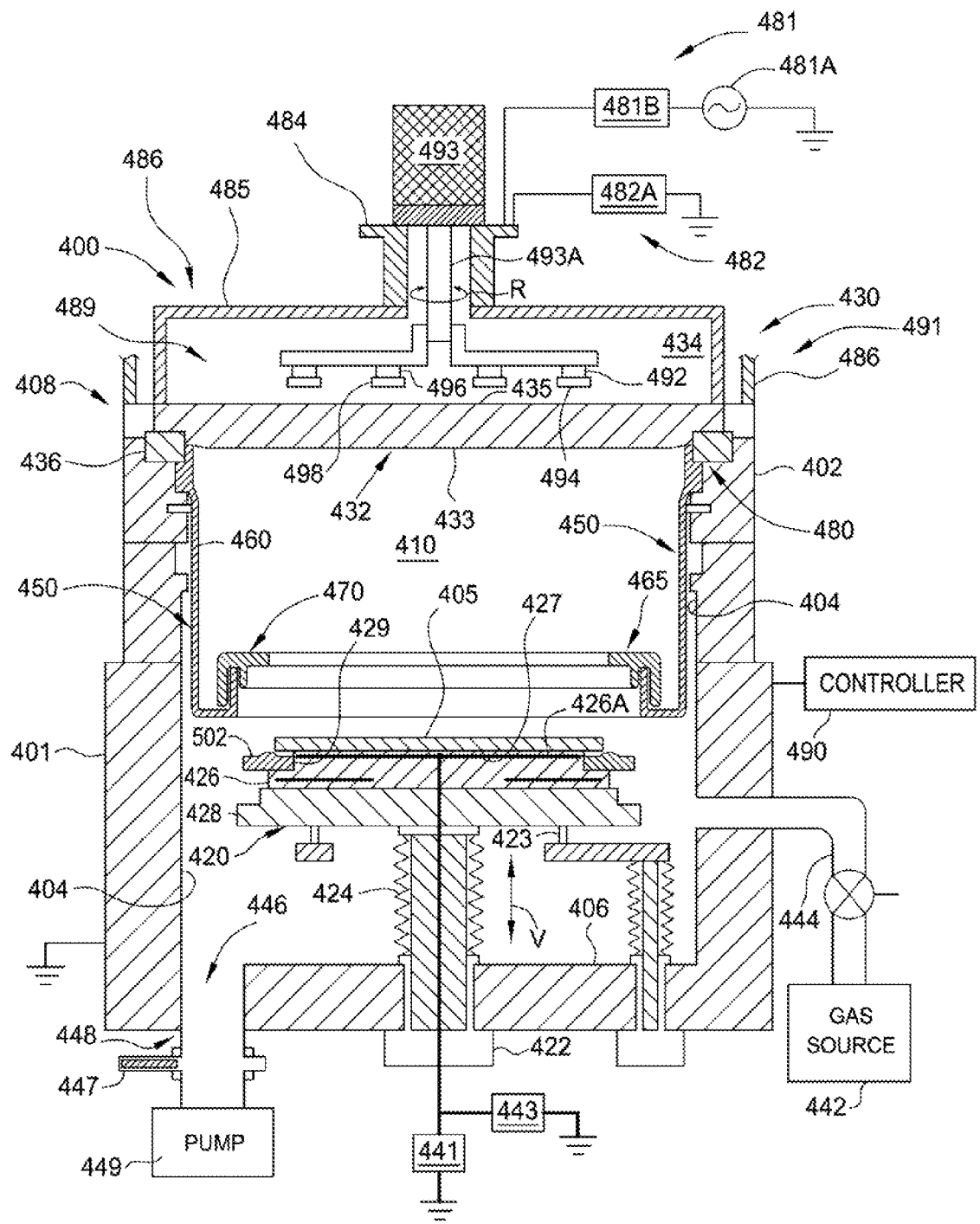
FIG. 4A illustrates a cross-sectional view of a chamber according to one embodiment of the invention.
Figure 4B:
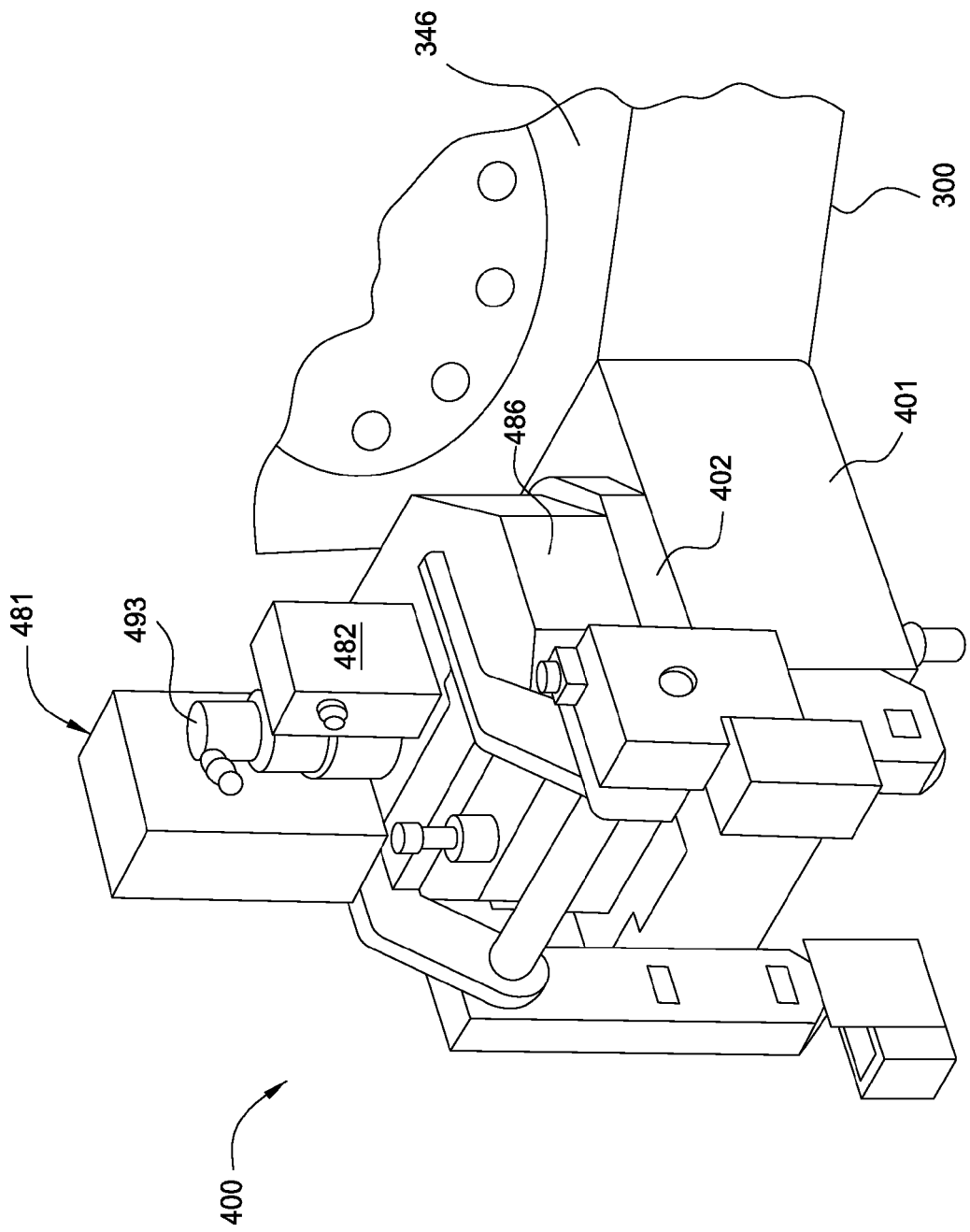
FIG. 4B depicts an isometric view of a chamber according to one embodiment of the invention.

At process 230, a tungsten film may be formed on the refractory metal nitride film layer using various methods. Reference to FIGS. 4A-4B may be used to illustrate the process. In one embodiment, the method for forming the tungsten film includes forming a plasma in a processing region 410 of a chamber 400 using an RF power supply 181 or DC power supply 182 coupled to a tungsten target 432 in the chamber 400. The tungsten target 432 has a first surface 433 that is in contact with the processing region 410 of the chamber 400 and a second surface 435 that is opposite the first surface 433. Energy is delivered to a plasma formed in a processing region 410 of a chamber, which may be from either the RF power supply 481 or the DC power supply 482 to the target 432. The RF power may be applied to the tungsten target at a power level within the range from about 5 kW to about 50 W. The RF power may be applied to the tungsten target at a power level within the range from about 1 kW to about 2.5 kW, such as about 1.5 kW. The DC power may be applied to the tungsten target at a power level within the range from about 5 kW to about 50 W. The DC power may be applied to the tungsten target at a power level within the range from about 1 kW to about 2.5 kW, such as about 1.5 kW or 2.0 kW. Although FIG. 4A shows both an RF and DC power source coupled to the target, the chamber may have only one power source type coupled to the tungsten target in some embodiments. In some embodiments, the process of forming a thin tungsten film having low resistivity will use only a DC power source coupled to the tungsten target along with an RF bias coupled to the substrate support. In other embodiments, the process of forming a thin tungsten film will only use an RF power source coupled to the tungsten target along with an RF bias coupled to the substrate support.

A magnetron 489 may rotate about the center point of the target 432, wherein the magnetron 489 is disposed adjacent the second surface 435 of the target 432. The magnetron 489 may include an outer pole 492 comprising a plurality of magnets 494 and an inner pole 496 comprising a plurality of magnets 498. The outer and inner poles 492, 496 may form a closed-loop magnetron assembly, wherein the ratio of the magnetic fields generated by the outer and inner poles 492, 496 is between about 1.56 and about 0.57. The magnetron and resulting magnetic fields affect the bombardment of the tungsten ions during the deposition process, and enables control of the thin film properties such as grain size and film density. In one embodiment, the processing chamber 400 is a short throw chamber where the spacing between the target and the substrate is from a range between 55 mm and 75 mm, for example 73 mm or 65 mm. The plasma may be ignited with a non-reactive gas such as Ar or Kr. In one embodiment, a plasma may be generated from an Ar gas having a flow rate within a range from about 35 sccm to about 75 sccm. For example, the non-reactive gas flow rate may be about 70 sccm, about 65 sccm, about 60 sccm, or about 40 sccm.

The process may also include heating the substrate support 126 in the chamber. The substrate or substrate support may be heated to a temperature within a range from about 50° C. to about 900° C. In one embodiment the substrate or substrate support may be heated to a temperature within a range from about 250° C. to about 400° C. For example, the substrate or substrate support may be heated to 250° C., 300° C., 350° C., or even 400° C. In some embodiments, the process may lack backside gas applied to the backside of the substrate during tungsten deposition. Backside gas may be used to aid in modifying the temperature profile of the substrate during processing. However, experiments have indicated that the resistivity of tungsten is lowered when no backside gas is used. It is believed that the backside gas may affect the electrical coupling of the substrate to the substrate support, the temperature profile of the substrate, or both, and thus not having the backside gas further affects and changes the properties of the tungsten film during deposition. The process may also include pressurizing the processing region 110 of the chamber to a pressure within a range from about 0.1 mTorr to about 10.0 mTorr, for example, 4.5 mTorr. In one embodiment, the processing region 410 is pressurized such that the plasma forms a capacitively coupled plasma (CCP plasma).

During the process 230, an RF bias may be applied to the substrate via the substrate support with an RF power supply. The RF bias may have a power level within a range from about 50 W to about 800 W. In one embodiment, the RF bias may have a power level within a range from about 200 W to 400 W. For example, the RF bias may have a power level of 100 W, 200 W, 300 W, or 400 W. The substrate bias may help to control step coverage and re-sputtering to optimize morphology of the deposited tungsten. The RF bias also helps to control bombardment of the ions on the substrate, thereby affecting the thin film properties such as grain size, film density, and other properties. RF bias provides extra kinetic energy to the tungsten ions, which may prompt large grain growth. In some embodiments, the frequency of the RF bias will be less than the frequency of the RF power source coupled to the target. For example, in some embodiments, the RF bias frequency may be 2 MHz while the RF power source frequency may be 13.56 MHz. In another embodiment, the RF bias frequency may be about 13.56 MHz and the RF power source frequency may be about 60 MHz. Generally, when using a combination of RF power and RF bias, the RF frequencies of each should avoid reactive energies between the target and the substrate support.

By using the various variables described above, a tungsten film may be deposited on a substrate 405 positioned on the substrate support 426 in the chamber 400. The tungsten film may be deposited at 370 Å per minute and may be 500 Å thick. The tungsten film stress can be compressive or tensile and modulated with target power, pressure, and temperature. For example, the tungsten film stress may be in a range from about −745.00 MPa to about 1730 MPa. In one embodiment, the tungsten film stress may be tensile in the range from about 1650.00 to about 1660.00 MPA. In another embodiment, the tungsten film stress may be compressive at −743.00 MPa.

It has been found that by controlling the deposition temperature, the RF bias, and the bombardment of tungsten ions onto the substrate, a thin tungsten film may be formed having a resistivity less than 12.0 µohms-cm. For example, the tungsten film may have a resistivity less than 11.6 µohms-cm. In some embodiments, the tungsten film resistivity may be less than 9.5 µohms-cm. In some embodiments, the tungsten film resistivity may be as low as 9.20 or 9.15 µohms-cm. In some embodiments. The tungsten film resistivity may be less than 9.00 µohms-cm.

It is believed that controlling the various deposition parameters above helps to control grain size, grain boundaries (film density), and surface roughness which may lead to lower resistivity of thin film tungsten. Additionally, trapped gases from neutrals in the PVD chamber, such as Ar, or Kr, and even trapped oxygen can also lead to high resistivity of a deposited thin film. Additionally, the trapping of electrons may become significant during thin film deposition which also affects resistivity. Thus, adjusting the grain size, the film density and using low flow non-reactive gas, e.g. Ar, may lead to lower resistivity. Increasing the density and the grain size to form larger grains may account for the lower resistivity of thin film tungsten due to less grain boundary electron scattering.

Bulk tungsten that may be refined at temperatures above its melting point of 3422° C. may have resistivity properties of 5.5 µohms-cm or less, and thereby form proper grain sizes and boundaries to reduce resistivity. However, the temperature of thin film deposition is generally limited and thus other factors may be necessary to affect grain size growth.

Enhanced ionization of tungsten may be achieved by using RF bias, increased pressure ranges to form CCP plasma, and increased power to the target, along with deposition temperature control. Improved ionization will enhance ion bombardment, thereby providing improved tungsten grain growth, grain size, and film density. Temperature also affects the grain size and the film density, but it may need to be balanced, as increasing temperature increases the grain size but decreases the film density. Lowering the temperature thus provides more dense film. However, by using the other variables to aid in controlling grain growth and film density, the thin film properties may be less sensitive to the temperature component thereby opening up the process window.

Further, the ion bombardment may also be improved using a magnetron assembly with imbalanced ratios within a certain range, and particularly when the imbalanced ratio has a greater magnetic field strength on the inner magnetic loop compared to the outer magnetic loop. Additionally, the thickness uniformity is improved by adjusting the magnetron imbalanced ratio. Improved ion bombardment may also provide less trapping or incorporation of Ar, $O_2$, etc. into the thin film, which also reduces the resistivity of the thin tungsten film.

The tungsten target 432 for the process 230 may be replaced with a titanium-silicon alloy target and similar process conditions may be used to form the refractory metal silicon nitride film layer previously described in process 220. Modification of the process 230 for formation of refractory metal silicon nitride film layer includes the flow of a nitrogen-containing gas. The nitrogen-containing gas (e.g., $N_2$) may have a flow rate within a range of 10 sccm to about 100 sccm, such as about 30 sccm.

Figure 2B:
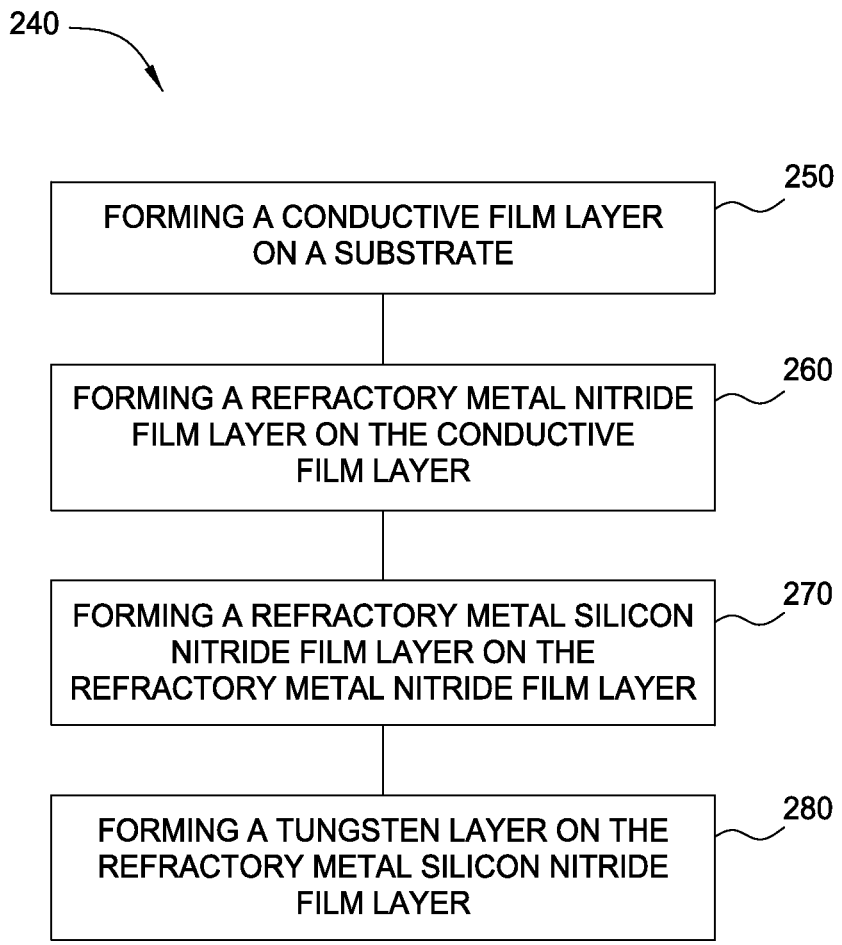
FIG. 2B illustrates a process diagram of another method of forming a gate electrode stack according to one embodiment of the invention.

FIG. 2B illustrates a process diagram of another method 240 of forming a gate electrode stack according to one embodiment of the invention. The gate electrode stack formed according to method 240 is similar to the gate electrode stack formed via method 200 except that during the method 240, a refractory metal nitride layer is deposited on the conductive film layer prior to deposition of the refractory metal silicon nitride film layer.

At process 250, a conductive film layer is formed on a substrate. The conductive film layer may be formed similarly to the conductive film layer deposited at process 210.

At process 260, a refractory metal nitride layer is formed on the conductive film layer using a PVD process. For example, when forming a titanium nitride layer, a plasma may be generated with nitrogen gas and power supplied to a titanium target to deposit a titanium nitride film. In one embodiment, a titanium seed layer is first deposited on a poly layer to improve adhesion of the titanium nitride layer subsequently formed on the titanium seed layer. In one embodiment, a DC power source may be applied to the target and an RF bias may be applied to the substrate support during deposition of the titanium seed layer and the titanium nitride layer.

At process 270, a refractory metal silicon nitride film layer is formed on the refractory metal nitride film layer. The refractory metal silicon nitride film layer may be deposited similarly to the refractory metal silicon nitride film layer formed at process 220.

At process 280, a tungsten layer is formed on the refractory metal silicon nitride film layer. The tungsten layer may be formed similarly to the tungsten layer formed at process 230.

Platforms

Formation of the gate electrode stack subsequent to the gate dielectric layer formation and conductive film layer formation may be performed in a processing system, such as the processing system/cluster tool 300 illustrated FIG. 3. Cluster tool 300 may be a dual buffer chamber, multiple process chamber semiconductor processing tool or dual buffer chamber cluster tool. The cluster tool 300 may be an ENDURA® platform having various attached chambers available from Applied Materials, Inc., located in Santa Clara, Calif. Attached to the duster tool 300 may be a factory interface (FI) 330 with one or more FOUPS 332 for handling and transporting substrates from one area of a semiconductor fab to another area. The FI 330 removes substrates 358 from the FOUPS 332 to begin the processing sequence. The cluster tool 300 has a first buffer chamber 346 and a second buffer chamber 350, and a first substrate transfer location 314 and a second substrate transfer location 316 disposed within a polygonal structure 344. The first buffer chamber 346 may be a low quality vacuum buffer and the second buffer chamber 350 may be a high quality vacuum. The substrate transfer locations may be a chamber.

A first and second load lock chamber 326 and 328 may be disposed on the one side of the polygonal structure 344. A first and second degas chamber 318 and 320 may be disposed on generally opposite sides of the polygonal structure and adjacent first and second load lock chambers 326, 328. A first pair of process chambers 302 and 304 may be disposed on generally opposite sides of the polygonal structure 344 and adjacent degas chambers 318 and 320 and buffer chamber 346. The first pair of process chamber 302, 304 may be a Versa™ W PVD chamber for forming a tungsten film on the substrate, available from Applied Materials, Inc., located in Santa, Clara, Calif. A second pair of process chambers 306 and 308 may be disposed on generally opposite sides of the polygonal structure 344 and adjacent buffer chamber 350. The second pair of process chambers may be a Falcon TTN PVD chamber, also available from Applied Materials, Inc., located in Santa Clara, Calif. A third pair of process chambers 310 and 312 may be disposed on generally opposite sides of the polygonal structure 344 and adjacent second pair of process chambers 306, 308 and buffer chamber 350. The third pair of process chambers may be chambers for depositing the refractory metal silicon nitride layer, also available from Applied Materials, Inc., located in Santa Clara, Calif.

All process and load lock chambers are selectively isolated from the buffer chambers 346 and 350 by plurality of slit valves (not shown) creating a first and second environment, 374 and 376, respectively. The polygonal structure 344 has a central wall 342 which separates buffer chambers 346 and 350. The central wall 342 separates the buffer chambers 346 and 350. The substrate transfer locations 314 and 316 provide individual passage though the central wall 342 to the buffer chambers 346 and 350. The substrate transfer locations 314 and 316 are selectively isolated from adjoining buffer chambers 346 and 350 by a plurality of slit valves (not shown). For example, one slit valve may be provided between first buffer chamber 346 and the first transfer location 314, one additional slit valve may be provided between first transfer location 314 and second buffer chamber 350, one slit valve may be provided between first buffer chamber 346 and second transfer location 316 and one slit valve may be provided between second buffer chamber 350 and second transfer location 316. The use of the slit valves allows for the pressure in each chamber to be individually controlled. Each substrate transfer location 314 and 316 additionally may have a substrate pedestal (not shown), respectively, for supporting the substrate in the chamber.

The first buffer chamber 346 is circumscribed by the load lock chambers 326 and 328, degas chambers 318, 320, process chambers 302 and 304, and substrate transfer locations 314 and 316. Each of the process chambers 302, 304, degas chambers 318, 320, and the load lock chambers 326, 328 are selectively isolated from the buffer chamber 346 by a slit valve (not shown). Located within buffer chamber 346 is a first robotic substrate transport mechanism 348, e.g., a multi-blade robot. Other types of transport mechanisms may be substituted. The first robotic substrate transport mechanism 348 shown may have substrate transport blades 360 supporting substrates 358. The blades 360 are used by first robotic substrate transport mechanism 348 for carrying the individual substrates 358 to and from the chambers circumscribing the first buffer chamber 346.

The second buffer chamber 350 is circumscribed by the process chambers 306, 308, 310 and 312, and substrate transfer locations 314 and 316. Located within buffer chamber 350 is a second robotic substrate transport mechanism 352, e.g., a multi-blade robot. Other types of transport mechanisms may be substituted. The second robotic substrate transport mechanism 352 shown may have substrate transport blades 360 supporting substrates 358. The blade 360 is used by second robotic substrate transport mechanism 352 for carrying the individual substrates to and from the chambers circumscribing the second buffer chamber 350.

The buffer chambers 346, 350 may have vacuum ports connected to a pumping mechanism (not shown) such as a turbo molecular pump, which is capable of evacuating the environments of chambers 346 and 350. The configuration and location of the vacuum ports may vary dependent on design criteria for individual systems.

Substrate processing, for example, may begin with the buffer chambers 346 and 350 being pumped down to a vacuum condition by a pumping mechanism. The first robotic substrate transport mechanism 348 retrieves a substrate 358 from one of the load lock chambers (e.g. 326) and carries that substrate to the first stage of processing, for example, the degas chamber 318 which may be used to degas the substrate 358 including structures formed thereon in preparation for subsequent processing. For example, the substrate 30 including the conductive film layer 26B of the gate electrode stack 25B may be degassed prior to formation of the remaining layers of the gate electrode.

In a next stage of processing, the substrate may be carried to any of the process chambers 306, 308 to perform the processes on the substrate as described above. Once the first robotic substrate transport mechanism 348 is no longer carrying a substrate, the first robotic substrate transport mechanism 348 can tend substrates in the other chambers surrounding buffer chamber 346. Once the substrate is processed and PVD stage deposits material upon the substrate, the substrate can then be moved to a second stage of processing, and so on. For example, the substrate may then be moved to any of processing chambers 310, 312 to perform the processes as described above, followed by moving the substrate to any or process chamber 302, 304 to perform the processes as described above.

If the required processing chamber is located adjacent to second buffer chamber 350, then the substrate must be transported into one of the substrate transfer locations (e.g. 314). The slit valve separating buffer chamber 346 and substrate transfer location 314 is opened. The first robotic substrate transport mechanism 348 transports the substrate into the substrate transfer location 314. The substrate transport blade 360 connected to first robotic substrate transport mechanism 348 is removed from substrate transfer location 314 leaving the substrate on the pedestal. After the slit valve separating the buffer chamber 346 and the substrate transfer location 314 is closed, a second slit valve separating the buffer chamber 350 and the substrate transfer location 314 is opened, allowing the substrate transport blade 360 connected to the second robotic substrate transport mechanism 352 to be inserted into substrate transfer location 314 to retrieve the substrate. Once the substrate is inside buffer chamber 350, the second slit valve is closed and the second robotic substrate transport mechanism 352 is free to move the substrate to the desired processing chamber or sequence of chambers serviced by buffer chamber 350 and second robotic substrate transport mechanism 352.

After substrate processing is complete, the substrate is loaded into a FOUP 332 on the FI 330, moving the substrate back through the substrate transfer location when necessary.

Tungsten PVD Chamber

FIG. 4A illustrates an exemplary semiconductor processing chamber 400 having an upper process assembly 408, a process kit 450 and a pedestal assembly 420, which are all configured to process a substrate 405 disposed in a processing region 410. The semiconductor processing chamber 400 may be a tungsten PVD deposition chamber such as processing chamber 302 or 304 on cluster tool 300 shown in FIG. 3. The process kit 450 includes a one-piece grounded shield 460, a lower process kit 465, and an isolator ring assembly 480. In the version shown, the processing chamber 400 comprises a sputtering chamber, also called a physical vapor deposition or PVD chamber, capable of depositing a single material from a target 432 on the substrate 405. The processing chamber 400 may also be used to deposit tungsten. It is contemplated that other processing chambers including those from other manufacturers may be adapted to benefit from one or more of the embodiments of the invention described herein.

The processing chamber 400 includes a chamber body 401 having sidewalls 404, a bottom wall 406, and an upper process assembly 408 that enclose a processing region 410 or plasma zone. The chamber body 401 is typically fabricated from welded plates of stainless steel or a unitary block of aluminum. In one embodiment, the sidewalls comprise aluminum and the bottom wall comprises stainless steel plate. The sidewalls 404 generally contain a slit valve (not shown) to provide for entry and egress of a substrate 405 from the processing chamber 400. Components in the upper process assembly 408 of the processing chamber 400 in cooperation with the grounded shield 460, pedestal assembly 420 and cover ring 470 confine the plasma formed in the processing region 410 to the region above the substrate 405.

A pedestal assembly 420 is supported from the bottom wall 406 of the chamber 400. The pedestal assembly 420 supports a deposition ring 502 along with the substrate 405 during processing. The pedestal assembly 420 is coupled to the bottom wall 406 of the chamber 400 by a lift mechanism 422, which is configured to move the pedestal assembly 420 between an upper processing position and lower transfer position. Additionally, in the lower transfer position, lift pins 423 are moved through the pedestal assembly 420 to position the substrate a distance from the pedestal assembly 420 to facilitate the exchange of the substrate with a substrate transfer mechanism disposed exterior to the processing chamber 400, such as a single blade robot (not shown). A bellows 424 is typically disposed between the pedestal assembly 420 and the chamber bottom wall 406 to isolate the processing region 410 from the interior of the pedestal assembly 420 and the exterior of the chamber.

The pedestal assembly 420 generally includes a support 426 sealingly coupled to a platform housing 428. The platform housing 428 is typically fabricated from a metallic material such as stainless steel or aluminum. A cooling plate (not shown) is generally disposed within the platform housing 428 to thermally regulate the support 426. One pedestal assembly 420 that may be adapted to benefit from the embodiments described herein is described in U.S. Pat. No. 5,507,499, issued Apr. 16, 1996 to Davenport et al. which is incorporated herein by reference in its entirety.

The support 426 may be comprised of aluminum or ceramic. The substrate support 426 has a substrate receiving surface 427 that receives and supports the substrate 405 during processing, the substrate receiving surface 427 being substantially parallel to a sputtering surface (e.g. first surface 433) of the target 432. The support 426 also has a peripheral edge 429 that terminates before an overhanging edge 405A of the substrate 405. The support 426 may be an electrostatic chuck, a ceramic body, a heater or a combination thereof. In one embodiment, the support 426 is an electrostatic chuck that includes a dielectric body having a conductive layer, or electrode 426A, embedded therein. The dielectric body is typically fabricated from a high thermal conductivity dielectric material such as pyrolytic boron nitride, aluminum nitride, silicon nitride, alumina or an equivalent material. Other aspects of the pedestal assembly 420 and support 426 are further described below. In one embodiment, the conductive layer 426A is configured so that when a DC voltage is applied to the conductive layer 426A, by an electrostatic chuck power supply 443, a substrate 405 disposed on the substrate receiving surface 427 will be electrostatically chucked thereto to improve the heat transfer between the substrate 405 and the support 426. In another embodiment, an RF bias controller 441 is also coupled to the conductive layer 426A so that a voltage can be maintained on the substrate during processing to affect the plasma interaction with the surface of the substrate 405.

The chamber 400 is controlled by a system controller 490 that is generally designed to facilitate the control and automation of the processing chamber 400 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 490 determines which tasks are performable on a substrate. Preferably, the program is software readable by the system controller 490 that includes code to perform tasks relating to monitoring, execution and control of the movement and various process recipe tasks and recipe steps being performed in the processing chamber 400. For example, the controller 490 can comprise program code that includes a substrate positioning instruction set to operate the pedestal assembly 420; a gas flow control instruction set to operate gas flow control valves to set a flow of sputtering gas to the chamber 400; a gas pressure control instruction set to operate a throttle valve or gate valve to maintain a pressure in the chamber 400; a temperature control instruction set to control a temperature control system (not shown) in the pedestal assembly 420 or sidewalls 404 to set temperatures of the substrate or sidewalls 404, respectively; and a process monitoring instruction set to monitor the process in the chamber 400.

The chamber 400 also contains a process kit 450 which comprises various components that can be easily removed from the chamber 400, for example, to clean sputtering deposits off the component surfaces, replace or repair eroded components, or to adapt the chamber 400 for other processes. In one embodiment, the process kit 450 comprises an isolator ring assembly 480, a grounded shield 460 and a deposition ring 502 for placement about a peripheral edge 429 of the support 426 that terminates before an overhanging edge of the substrate 405.

FIG. 4B is an isometric view of the processing chamber 400 that is coupled to a processing position of a cluster tool 300. The cluster tool 300 may also contain other processing chambers such as shown in FIG. 3 that are adapted to perform one or more processing steps on a substrate prior to or after performing the deposition process in the processing chamber 400. An exemplary cluster tool 300 may include a CENTURA® platform or an ENDURA® platform system available from Applied Materials, Inc., Santa Clara, Calif. In one example, the duster tool 300 may have processing chambers that are configured to perform a number of substrate processing operations such as cyclical layer deposition, chemical vapor deposition (CVD), physical vapor deposition (PVD), atomic layer deposition (ALD), etch, pre-clean, degas, anneal, orientation and other substrate processes. A transfer tool, for example, the first robotic substrate transport mechanism or robot 348 disposed in the transfer chamber 346, may be used to transfer substrates to and from one or more chambers attached to the cluster tool 300.

The upper process assembly 408 may also comprise an RF power supply 481, a direct current (DC) power supply 482, an adaptor 402, a motor 493, and a lid assembly 430. The lid assembly 430 generally comprises a target 432, a magnetron 489 and a lid enclosure 491. The upper process assembly 408 is supported by the sidewalls 404 when in a closed position, as shown in FIGS. 4A and 4B. A ceramic target isolator 436 is disposed between the isolator ring assembly 480, the target 432 and adaptor 402 of the lid assembly 430 to prevent vacuum leakage therebetween. The adaptor 402 is sealably coupled to the sidewalls 404, and is configured to help with the removal of the upper process assembly 408 and isolator ring assembly 480.

When in the processing position, the target 432 is disposed adjacent to the adaptor 402, and is exposed to the processing region 410 of the processing chamber 400. The target 432 contains material that is deposited on the substrate 405 during a PVD, or sputtering, process. The isolator ring assembly 480 is disposed between the target 432 and the shield 460 and chamber body 401 to electrically isolate the target 432 from the shield 460 and chamber body 401.

During processing, the target 432 is biased relative to a grounded region of the processing chamber (e.g., chamber body 401 and adaptor 402) by a power source disposed in the RF power supply 481 and/or the direct current (DC) power supply 482. In one embodiment, the RF power supply 481 comprises an RF power supply 481A and an RF match 481B that are configured to efficiently deliver RF energy to the target 432. In one example, the RF power supply 481A is capable of generating RF currents at a frequency of between about 13.56 MHz and about 60 MHz at powers between about 0 and about 4.5 kW. In one example, the DC power supply 482A in the DC power supply 482 is capable of delivering between about 0 and about 2.5 kW of DC power. In another example, the RF power supply 481A is capable of generating an RF power density of between about 15 and about 45 kW/m$^2$ at the target and the DC power supply 482 is capable of delivering a power density of between about 15 and about 45 kW/m$^2$.

During processing, a gas, such as argon, is supplied to the processing region 410 from a gas source 442 via conduits 444. The gas source 442 may comprise a non-reactive gas such as argon, krypton, helium or xenon, which is capable of energetically impinging upon and sputtering material from the target 432. The gas source 442 may also include a reactive gas, such as one or more of an oxygen-containing gas or a nitrogen-containing gas, which is capable of reacting with the sputtering material to form a layer on a substrate. Spent process gas and byproducts are exhausted from the chamber 400 through exhaust ports 446 that receive spent process gas and direct the spent process gas to an exhaust conduit 448 having an adjustable position gate valve 447 to control the pressure in the processing region 410 in the chamber 400. The exhaust conduit 448 is connected to one or more exhaust pump 449, such as a cryopump. Typically, the pressure of the sputtering gas in the chamber 400 during processing is set to sub-atmospheric levels, such as a vacuum environment, for example, a pressure of about 0.1 mTorr to about 10.0 mTorr. In one embodiment, the processing pressure is set to about 2.5 mTorr to about 6.5 mTorr. A plasma is formed between the substrate 405 and the target 432 from the gas. Ions within the plasma are accelerated toward the target 432 and cause material to become dislodged from the target 432. The dislodged target material is deposited on the substrate.

The lid enclosure 491 generally comprises a conductive wall 485, a center feed 484 and shielding 486 (FIGS. 4A and 4B). In this configuration, the conductive wall 485, the center feed 484, the target 432 and a portion of the motor 493 enclose and form a back region 434. The back region 434 is a sealed region disposed on the back side of the target 432 and is generally filled with a flowing liquid during processing to remove the heat generated at the target 432 during processing. In one embodiment, the conductive wall 485 and center feed 484 are configured to support the motor 493 and magnetron system 489, so that the motor 493 can rotate the magnetron system 489 during processing. In one embodiment the motor 493 is electrically isolated from the RF or DC power delivered from the power supplies by use of a dielectric layer such as DELRIN®, G10, or ARDEL® films.

The shielding 486 may comprise one or more dielectric materials that are positioned to enclose and prevent the RF energy delivered to the target 432 from interfering with and affecting other processing chambers disposed in the cluster tool 403 (FIG. 4B). In one configuration, the shielding 486 may comprise a DELRIN®, G10, or ARDEL® films or other similar material and/or a thin grounded sheet metal RF shield.

In one embodiment of the processing chamber 400, an RF bias controller 441 (FIG. 4A) is coupled between an electrode and RF ground to adjust the bias voltage on the substrate during processing to control the degree of bombardment on the substrate surface. In one embodiment, the electrode is disposed adjacent to the substrate receiving surface 427 of a support 426, and comprises the electrode 426A. In a PVD reactor, tuning of the bombardment of the substrate surface by the control of the impedance of the electrode to ground, will affect the deposited film's properties, such as grain size, film stress, crystal orientation, film density, roughness and film composition. Therefore, the RF bias controller 441 can thus be used to alter the film properties at the substrate surface.

Figure 5:
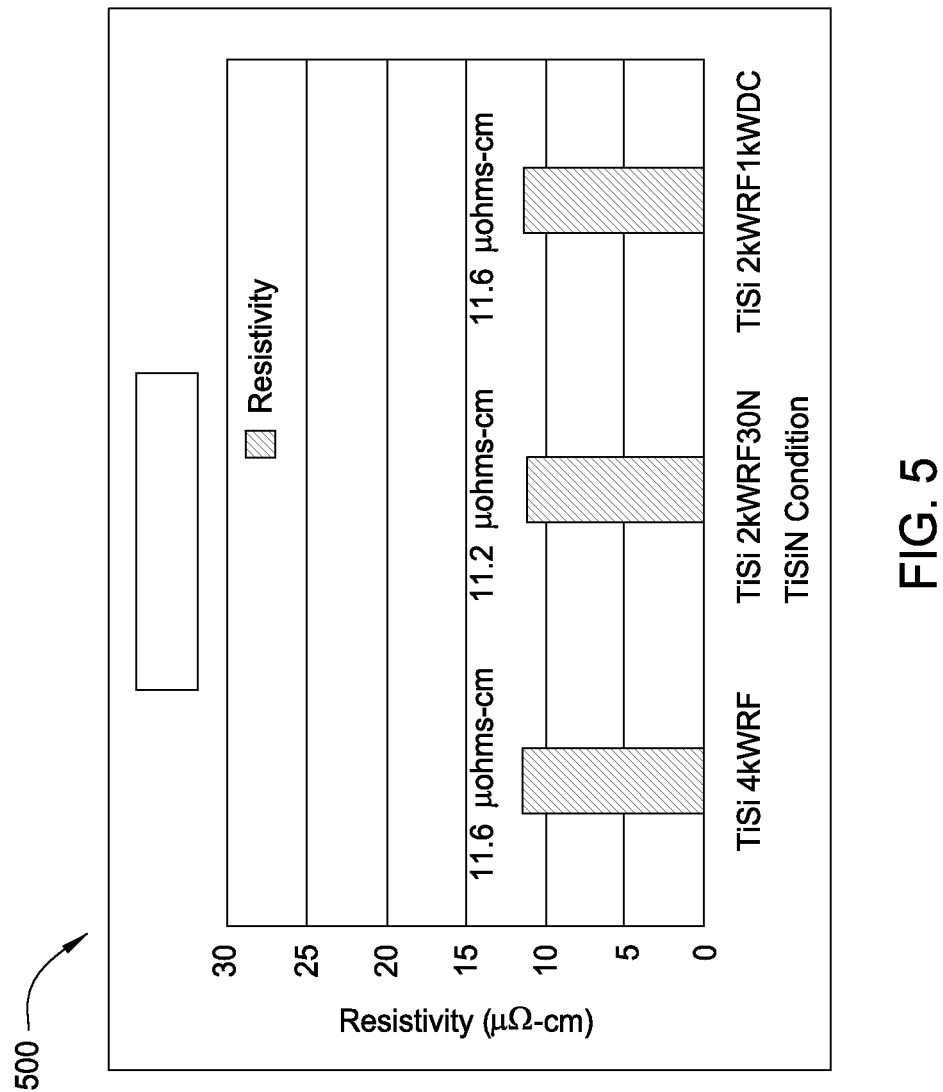
FIG. 5 is a plot depicting the resistivity ($\mu$ohms-cm) of tungsten films deposited on various titanium-silicon nitride film underlayers formed according to embodiments of the invention.

FIG. 5 is a plot 500 depicting the resistivity (µohms-cm) of tungsten films deposited on various titanium-silicon nitride film underlayers formed according to embodiments of the invention. The y-axis represents Resistivity (µohms-cm) of the tungsten films deposited on the TiSiN film underlayers and the x-axis represents the deposition conditions for three TiSiN film underlayers. The first TiSiN film was deposited using a PVD process with 4 kW RF and a nitrogen flow rate of 20 sccm. The tungsten film deposited on the first TiSiN film had a resistivity of 11.6 µohms-cm. The second TiSiN film was deposited using a PVD process with 2 kW RF and a nitrogen flow rate of 30 sccm. The tungsten film deposited on the second TiSiN film had a resistivity of 11.2 µohms-cm. The third TiSiN film was deposited using a PVD process with a combination of 2 kW RF and 1 kW DC and a nitrogen flow rate of 30 sccm. The tungsten film deposited on the third TiSiN film has a resistivity of 11.2 µohms-cm.

While the foregoing is directed to embodiments of the invention, other and further embodiments of the invention may be devised without departing from the basic scope thereof.

What is claimed is:

1. A method of depositing a tungsten film layer, comprising:
    forming a conductive film layer on a substrate;
    forming a titanium nitride film layer on the conductive film layer;
    forming a plasma in a processing region of a first chamber using an RF power supply coupled to a titanium silicon alloy target in the first chamber, the titanium silicon alloy target having a first surface that is in contact with the processing region of the first chamber and a second surface that is opposite the first surface;
    rotating a first magnetron about the center point of the titanium silicon alloy target;
    biasing a substrate support positioned in the first chamber with an RF power supply coupled to the substrate support;
    flowing a nitrogen-containing gas into the processing region of the first chamber;
    depositing a titanium silicon nitride film layer on the titanium nitride film layer while the substrate is positioned on the substrate support in the first chamber; and
    forming the tungsten film layer on the titanium silicon nitride film layer, wherein forming the tungsten film layer comprises:
        forming a plasma in a processing region of a second chamber using an RF power supply coupled to a tungsten target in the second chamber, the tungsten target having a first surface that is in contact with the processing region of the second chamber and a second surface that is opposite the first surface;
        rotating a second magnetron about the center point of the tungsten target;
        biasing a substrate support positioned in the second chamber with an RF power supply coupled to the substrate support positioned in the second chamber; and
        depositing the tungsten film layer on the titanium silicon nitride film layer positioned on the substrate support in the second chamber, wherein a frequency of the RF power supply coupled to the tungsten target is greater than a frequency of the RF power supply coupled to the substrate support positioned in the second chamber.

2. The method of claim 1, wherein the first magnetron is disposed adjacent the second surface of the titanium silicon alloy target, the first magnetron comprising:
    an outer pole comprising a first plurality of magnets; and
    an inner pole comprising a second plurality of magnets, wherein the outer pole and the inner pole form a closed-loop magnetron assembly.

3. The method of claim 2, wherein a ratio of the magnetic fields generated by the outer pole and the inner pole is between 1.56 and 0.57.

4. The method of claim 1, further comprising heating the substrate support positioned in the first chamber.

5. The method of claim 1 wherein the processing region of the first chamber is pressurized from 2.5 mTorr to 6.5 mTorr.

6. The method of claim 4, wherein the substrate support positioned in the first chamber is heated to a temperature from 50° C. to 900° C.

7. The method of claim 1, wherein the frequency of the RF power supply coupled to the titanium silicon alloy target is greater than the frequency of the RF power supply coupled to the substrate support positioned in the first chamber.

8. The method of claim 1, wherein the titanium-silicon alloy target includes from 5 atomic percent to 95 atomic percent silicon and from 5 atomic percent to 95 atomic percent titanium.

9. The method of claim 1, wherein the conductive film layer is a polysilicon film layer.

10. The method of claim 9, further comprising forming a titanium seed layer on the conductive film layer prior to depositing the titanium nitride film layer.

11. The method of claim 1, wherein the tungsten film layer has a resistivity between 11 to 12 µohms-cm.

* * * * *